United States Patent [19]

Haas et al.

[11] Patent Number: 5,833,869

[45] Date of Patent: *Nov. 10, 1998

[54] METHOD FOR ETCHING PHOTOLITHOGRAPHICALLY PRODUCED QUARTZ CRYSTAL BLANKS FOR SINGULATION

[75] Inventors: Kevin Haas, Hoffman Estates; Robert Witte, Algonquin; Sang Kim, Cicero, all of Ill.

[73] Assignee: Motorola Inc., Schaumburg, Ill.

[ * ] Notice: The term of this patent shall not extend beyond the expiration date of Pat. No. 5,650,075.

[21] Appl. No.: 782,690

[22] Filed: Jan. 16, 1997

Related U.S. Application Data

[63] Continuation-in-part of Ser. No. 450,661, May 30, 1995, Pat. No. 5,650,075.

[51] Int. Cl.[6] .............................. B44C 1/22; C03C 15/00; C03C 25/06; H01L 21/306
[52] U.S. Cl. .................................. 216/2; 216/97; 216/80; 216/51; 438/50
[58] Field of Search ................................ 216/97, 51, 80, 216/2; 438/50

[56] References Cited

U.S. PATENT DOCUMENTS

| | | | |
|---|---|---|---|
| 4,035,674 | 7/1977 | Oguchi et al. | 310/9.5 |
| 4,542,397 | 9/1985 | Biegelsen et al. | 357/32 |
| 4,632,898 | 12/1986 | Fister et al. | 430/313 |
| 4,732,647 | 3/1988 | Aine | 156/633 |
| 4,897,360 | 1/1990 | Guckel et al. | 437/7 |
| 5,447,601 | 9/1995 | Norris | 216/2 |
| 5,650,075 | 7/1997 | Haas et al. | 216/97 |
| 5,681,484 | 10/1997 | Zanzucchi et al. | 216/2 |

Primary Examiner—James C. Housel
Assistant Examiner—Ginny Allen Portner
Attorney, Agent, or Firm—Brian M. Maucini; Gary J. Cunningham

[57] ABSTRACT

A method (202) for etching photolithographically produced quartz crystal blanks for singulation. In a first step (202), a quartz wafer is plated on both sides with metal and subsequently coated on both sides with photoresist. In a second step (204), the photoresist is patterned and developed and the metal layer on one side is etched through to form a narrow channel in the quartz defining a perimeter of a quartz blank. In a third step (206), the quartz channel is preferentially etched partially into the wafer along parallel atomic planes to provide a mechanically weak junction between the quartz wafer and the blanks to be singulated. In a fourth step (208), the photoresist layers are stripped from the quartz wafer. In a final step (210), the quartz blank is cleaved substantially along the bottom of the quartz channel to singulate the crystal blanks from the quartz wafer.

10 Claims, 5 Drawing Sheets

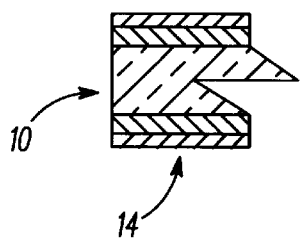
FIG.3
—PRIOR ART—
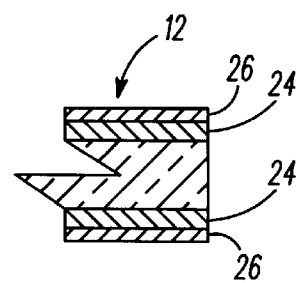
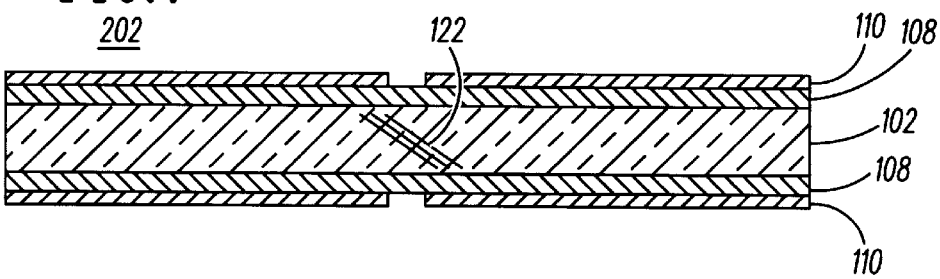
FIG.4
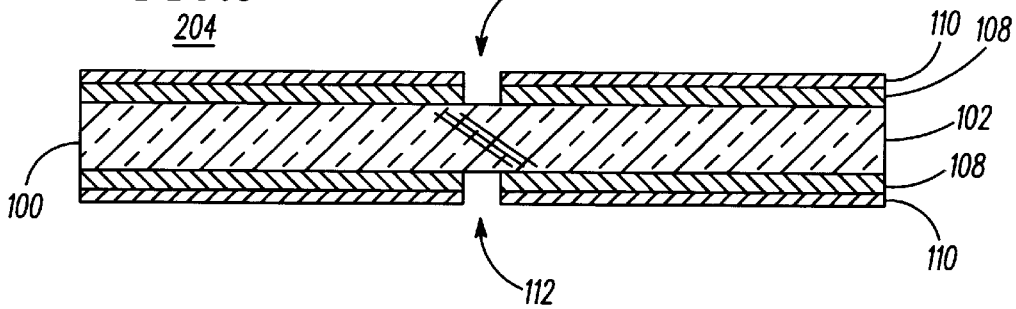
FIG.5
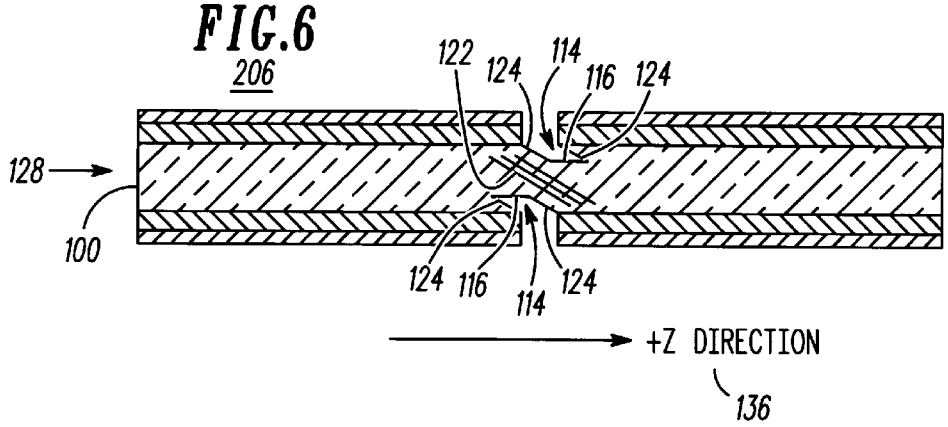
FIG.6

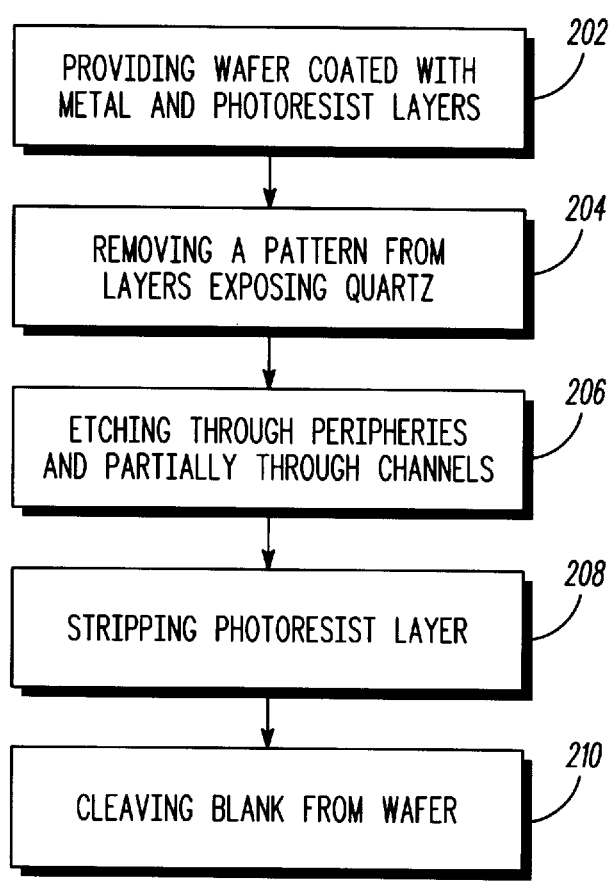

5,833,869

METHOD FOR ETCHING PHOTOLITHOGRAPHICALLY PRODUCED QUARTZ CRYSTAL BLANKS FOR SINGULATION

This is a continuation-part- of application Ser. No. 08/450,661, filed May 30, 1995, and issued as U.S. Pat. No. 5,650,075.

FIELD OF THE INVENTION

The present invention relates generally to piezoelectric devices and, in particular, to a method for etching photolithographically produced quartz crystal blanks for singulation.

BACKGROUND OF THE INVENTION

Piezoelectric elements are known to include various types and shapes of devices produced from various piezoelectric materials. Typical piezoelectric elements consist of substantially rectangular or round plates made from quartz. These piezoelectric elements are commonly used for frequency control in electronic devices such as, computers, cellular phones, pagers, radios and wireless data devices, etc. As consumer demand continually drives down the size and cost of this equipment, the need for piezoelectric devices to be smaller, lower cost and automatable has become even greater.

Automated mounting equipment typically requires that each piezoelectric element, as presented to the mounting equipment, be uniform in size and shape. Typically, this equipment can include a robotic machine with a vision system, a pick-and-place system, and the like. As the size of the devices to be mounted shrink, automation systems require tighter and tighter tolerances from the elements to be mounted in order to reduce breakage, misplacement and jamming.

In FIG. 1, prior art photolithographically produced piezoelectric elements 10 are shown before being singulated. These elements 10 are defined by etching a pattern through a parent wafer 12 but leaving each element 10 connected to the wafer 12 by one or more relatively thin bridge sections 16.

These bridges 16 have been designed to retain the full thickness of the parent wafer 12, and are necessary in order to have each element 10 remain in place so that further wafer 12 processing can be done in bulk. The use of bridges 16 avoids a handling problem that would occur with individual elements 10, as shown in FIG. 2.

Photolithographic processing of piezoelectric wafers 12 is known in the art and includes coating a piezoelectric wafer 12 with metal 24 and photoresist 26, respectively, as shown in FIG. 3. This is followed by developing the photoresist 26, etching the metal 24, and etching through the piezoelectric wafer 12 to define each element 10. Additional processing may include photoresist stripping, wafer cleaning and element 10 testing procedures which are much easier to accomplish when all the elements 10 are held in known positions on the parent wafer 12. However, after fully processing the wafer 12 it eventually becomes necessary to singulate the elements 10 from the parent wafer 12 in order to mount the elements 10 in individual packages. To assist in singulation, a relatively large relief area 20 (in FIG. 1), is etched through the parent wafer 12 near the separation edge 14 at the same time the element 10 is being defined, by etching through a remaining boundary 22 around the periphery of the element 10. This etching process leaves the element 10 connected to the parent wafer 12 by one or more bridges 16 which retain the full thickness of the parent wafer 12. The use of a relief area 20 near the separation edge 14 of the element 10 concentrates the breaking stresses of singulation at or near the bridges 16.

FIG. 2 shows a prior art singulated piezoelectric element 10. Singulation of the elements 10 from their parent wafer 12 by breaking the bridges 16 near the separation edges 14 can cause unpredictable damage. Many times, the body of the element 10 will fracture instead of the bridges 16. This type of breakage destroys the usability of the element 10, increasing scrap, lowering yields and raising costs. Even when the bridges 16 fracture as required, there occasionally remains irregular spurs 18 on the separation edge 14 of the piezoelectric element 10 where the bridges 16 did not break cleanly. Often, these irregular spurs 18 on the separation edge 14 are so pronounced that it is not possible to mount the element on that edge 14. Therefore, it is necessary to visually observe the quality of the edges of the piezoelectric element in order to mount the element on it's best edge, usually being the opposite edge 28. This type of visual inspection is a hindrance to automation.

FIG. 3 shows a cross-sectional view across the relief area 20 used in prior art etching of piezoelectric elements 10. The widths of the etched-through relief areas 20 and boundaries 22 are so large that anisotropic etching of the piezoelectric material and alignment of the top and bottom photolithographic patterning are essentially not a consideration in the prior art. The prior art assumes that all areas etched from both the top and bottom of a wafer 12 should always intersect (shown as item 20), to etch through the wafer 12.

Another consideration in the singulation of photolithographically produced blanks is that piezoelectric elements are very sensitive to their environment. Any particulates that contact the surface of the piezoelectric element can alter its frequency. Typically, an element is hermetically sealed under very controlled conditions. However, these sealing processes do not address particulate contamination that may occur during singulation. Previously, on photolithographically produced elements, singulation of the elements caused unpredictable fragmentation of the bridges (shown as 16 in FIG. 1). These bridges would fragment into pieces having a large variety of sizes. The smallest fragments adhere to the surface of the piezoelectric element by cohesive forces. The presence of this microscopic particulate matter on the surface of an element causes alterations of the frequency response of the element at varying input power levels. This phenomenon is known is "drive level dependence" or "starting resistance" in the art.

The most common method for eliminating this microscopic particulate is to add various cleaning stages to the process. Prior art cleaning can include mechanical brushing, wet processing, ultrasonic cleaner, plasma cleaner and the like. These solutions are problematic in that there is the potential of introducing more contamination than was originally present, unless these cleaning processes are very well controlled and monitored The present invention solves this problem by minimizing the generation of particulate matter before potential problems occur. In addition, extra cleaning processes can be avoided, thus lowering costs.

A significant portion of the cost of a quartz blank is in processing, yield and labor. Scrap costs due to yield losses are to be minimized if at all possible. Yields losses result from breakage and contamination of blanks. Reducing inspection steps and operator involvement can save money and reduce the possibility for error. Improvements in automatability, yield, cost and quality can be achieved if an inherently clean and repeatable method for singulating uniform quartz blanks is used.

There is a need for an improved method for singulating quartz blanks, that: (i) is low cost; (ii) improves yields; (iii) minimizes the potential for damage to the piezoelectric element; (iv) reduces particulate contamination on the piezoelectric element due to ineffectual breakout of the piezoelectric element; (v) reduces processing; and (vi) produces substantially uniform blank dimensions, which can contribute to simplifying mounting and reducing the need for inspection.

BRIEF DESCRIPTION OF THE DRAWINGS

FIG. 3 shows a cross-sectional view along lines 3—3 in FIG. 1, of a prior art quartz wafer showing the etched through area between the quartz blank and wafer;

FIG. 4 shows a cross-sectional view of a quartz wafer as coated with metal and photoresist layers, respectively, in accordance with the present invention;

FIG. 5 shows a cross-sectional view of the quartz wafer with the photoresist and metal layers removed from a pattern, in accordance with the present invention;

FIG. 6 shows a cross-sectional view of the quartz wafer with channels etched in alignment with the crystallographic orientation of the quartz, in accordance with the present invention;

FIG. 8 shows a block diagram for a method of singulating photolithographically produced quartz crystal blanks, in accordance with the present invention.

DETAILED DESCRIPTION OF THE PREFERRED EMBODIMENT

Figure 1:
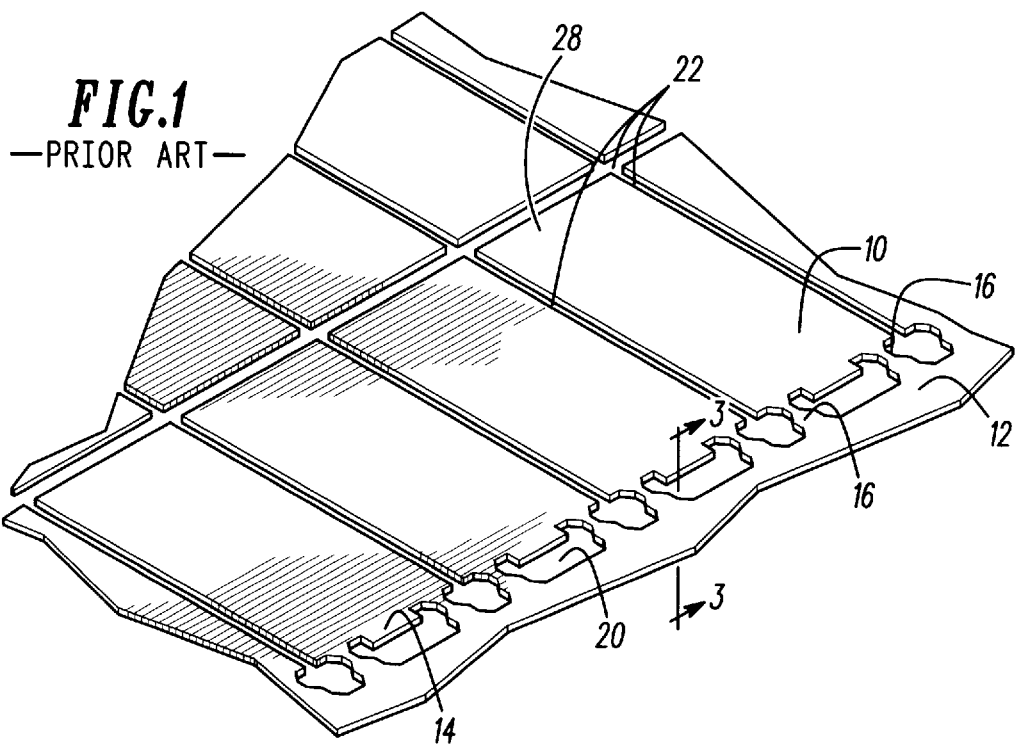
FIG. 1 shows a perspective view of a prior art photolithographically produced quartz wafer before singulation.
Figure 2:
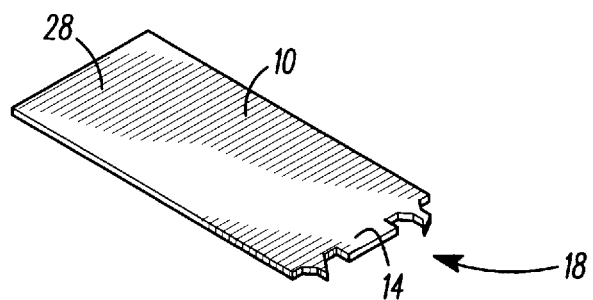
FIG. 2 shows a perspective view of a prior art quartz blank after singulation.

The present invention provides a method for etching photolithographically produced quartz crystal blanks and similar piezoelectric elements for singulation.

As shown in FIG. 4, a quartz wafer 102 is provided having a metal layer 108 subsequently coated with a photoresist layer 110 on both sides of the wafer 102. The metal layer 108 may include various numbers or configurations of conductive materials, metals or alloys in various numbers of layers. Most commonly, gold, silver, copper or aluminum is used for the metal layer 108 because of the enhanced conductivity that these materials possess over most other materials. Preferably, the metal layers 108 are comprised of a first layer of chromium and a second layer of gold on each side of the quartz wafer 102. However, it should be recognized that the amount, type and number of conductive layers used can vary. In this instance, chromium provides the advantage of good adhesion to the quartz wafer 102, and gold has the advantages of good conductivity and corrosion resistance.

Preferably, the metal layers 108 should be substantially impervious to quartz etchants because the photoresist layers 110 will not completely inhibit the quartz etchants. The metal layers 108 may be deposited on the wafer 102 using various conventional methods known in the art, including, but not limited to, evaporative deposition, sputter deposition, chemical vapor deposition, e-beam deposition and ion deposition. Preferably, e-beam evaporative deposition equipment is used to deposit the metal layers 108, such as the evaporators available from CHA Industries (of Menlo Park, Calif.).

The photoresist layers 110 may be of a negative or positive exposure type. It should be recognized that most types of photoresist will work equally well for this invention. This is because the line widths being used, about 0.5 mils (12.7 μm) or larger, are much larger and easier to work with than typical micron-linewidth semiconductor applications. The photoresist may be spun on using conventional, commercial photoresist spinner equipment, such as those manufactured by Solitec (of Santa Clara, Calif.).

In a preferred embodiment, metal and photoresist layers 108, 110 are provided on both sides of the quartz wafer 102.

Alternatively, a photoresist layer 110 may be provided on only one surface of the quartz wafer 102. In this case, the quartz wafer 102 would be patterned only on the side coated with the photoresist layer 110. After coating the wafer 102 with the photoresist layer 110, the photoresist layer 110 is cured in a convection type, air vented oven (such as one manufactured by Blue-M Electric of Watertown, Wis.).

Referring to FIG. 5, the quartz wafer 102 is shown after selected portions of the photoresist and metal layers 108, 110 have been patterned, developed and etched. The photoresist layer 110 was first exposed to a pattern 112 with ultraviolet light. The pattern 112 is defined on the wafer 102 by an ultraviolet exposure system using a photomask. In a preferred embodiment, a Hybrid Technology Group, Inc. Series 80 mask aligner (manufactured by HTG, Inc. of San Jose, Calif.) is used, to define the pattern 112 on one or both sides of the quartz wafer 102. However, it should be understood that various other mask aligner systems could be utilized, since line width tolerances are not critical in this application.

After exposure, the photoresist layer 110 is developed in a photoresist developer bath, and rinsed in a deionized water bath. Then the metal layers 108 are etched away in a metal etch bath followed by a rinse in a deionized water bath.

This process reveals a portion of the surface of the quartz wafer 102. In a preferred embodiment, each of the developer, rinse and metal etch baths are manufactured by Semifab, Inc. (of Hollister, Calif.). However, as should be understood, other equipment can be utilized in this connection. In fact, most suitable photolithographic processing equipment may be used in connection with this invention.

The quartz wafers 102 are then transferred to a quartz etchant bath for etching the revealed portions of the quartz wafer 102 (as shown in FIG. 6). After quartz etching, the wafers 102 are rinsed in deionized water. The wafers 102 are then stripped of their photoresist layers in a stripping bath, and again rinsed in the deionized water bath. In a preferred embodiment, each of the quartz etch, rinse and stripper baths are manufactured by Semifab, Inc. (of Hollister, Calif.). Other suitable photolithographic processing equipment may be used.

Figure 7A:
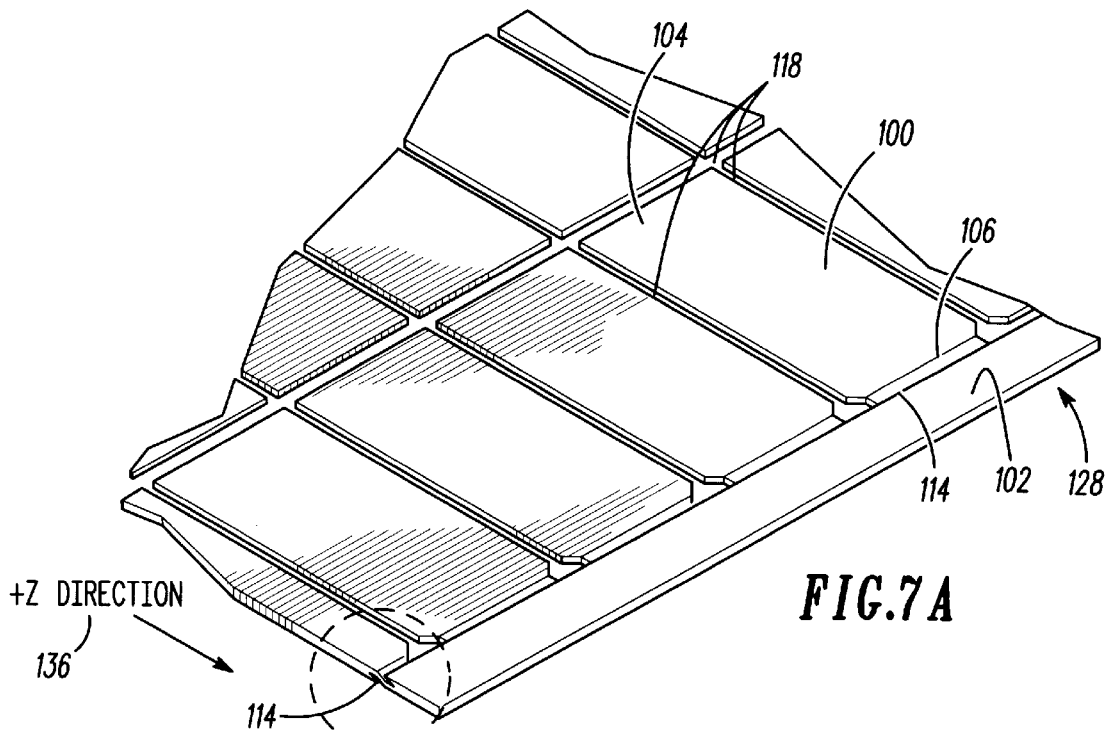
FIG. 7 shows a perspective view of a preferred embodiment of a photolithographically produced quartz wafer before singulation, with an enlarged detailed view of the etched channels, in accordance with the present invention.
Figure 7B:
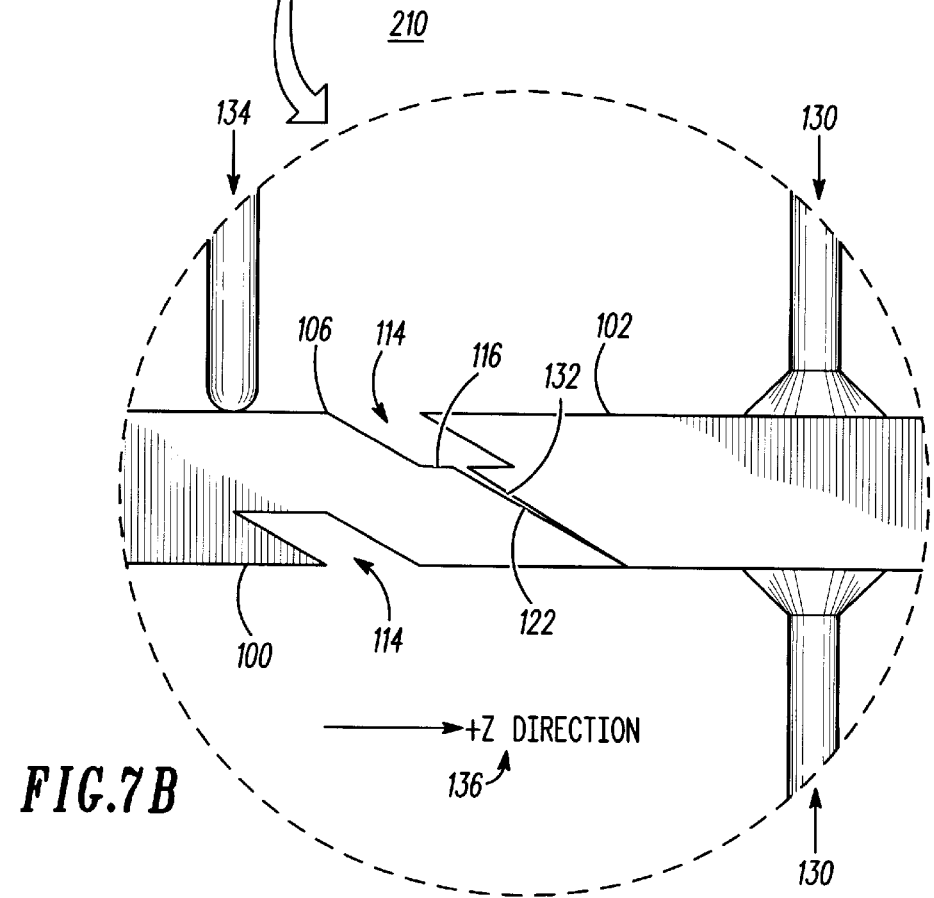

The quartz blanks 100 are then cleaved from the quartz wafer 102 in a simple manual singulation jig (shown as item 130 in the insert of FIG. 7). The jig 130 clamps the wafer near a breakout edge 106 of each quartz blank 100, and a bending force 134 is manually applied near a free edge 104 of each quartz blank 100 to fracture 132 a quartz channel 114, singulating the blank 100. The precise configuration of the clamp 130 is not critical to the invention. However it is important that the bending force 134 is applied so as to prevent scratching of the surface of the blank 100. Preferably, the bending force 134 is applied directly at or near the free edge 104 of the quartz blank 100. In a preferred embodiment, this operation is automated.

Referring to FIGS. 4 and 8, the first major step of the invention is providing a quartz wafer 102 with metal and photoresist layers 108, 110, identified as item 202. In a preferred embodiment, the quartz wafer 102 is evaporated with at least 10 Å of chromium followed by at least 200 521 of gold. The exact thickness of the metal layers 108 are not critical to the invention. However, the chromium layer should be at least thick enough to prevent the subsequent gold layer from penetrating through the chromium layer during deposition, and the gold layer should be thick enough to be electrically conductive and substantially nonporous to the quartz etchant. The metal layers 108 should be nonporous to quartz etchants because the photoresist layers 110 may not sufficiently inhibit penetration of the quartz etchants to areas of the quartz wafer 102 that should remain unetched.

In a preferred embodiment, about 500 Å of chromium is deposited followed by about 4000 Å of gold.

A photoresist layer 110 is then spun on per the manufacturer's recommendations. In a preferred embodiment, a Shipley Microposit™ S1400-31 photoresist (available from Shipley of Newton, Mass.) is used for the photoresist layers 110.

This is followed by baking in a convection type, air vented oven (such as one manufactured by Blue-M Electric of Watertown, Wis.) at a temperature of about 90° C. for about 15 minutes for each side of the wafer 102. Other similar photoresists may be used with acceptable results. Preferably, both sides of the wafer 102 are provided with photoresist layers 110. However, the photoresist layer 110 may be provided on only one side of the wafer 102.

Referring to FIGS. 5 and 8, the next process step 204 provides for removing a pattern 112 from portions of the quartz wafer 102. The quartz wafer 102 is exposed to ultraviolet light, through a glass photomask, at a light concentration of about 25 milliwatts per square centimeter for a period of about 6 seconds. In a preferred embodiment, the pattern 112 defining the channel 114 is of about 0.5 mils (12.7 μm) in width for a quartz wafer thickness 128 of about 3.9 mils (99 μm). Then the quartz wafer 102 is placed in a developing bath of Shipley Microposit™ 351 developer (available from Shipley of Newton, Mass.) at about 25° C. for about 1.5 minutes, followed by a deionized water rinse for at least 30 seconds. The quartz wafer is then placed in a gold etchant bath of Techni-strip™ AU (sodium cyanide type) (available from Lawrence Packaging Supply of Newark, N.J.) at about 25° C. for about 1 to about 5 minutes, depending on the thickness of the metal layer 108. The use of a preferred 4000 Å thick gold layer requires about 4 minutes of gold etch time. This process step is followed by a deionized water rinse for at least 30 seconds. The quartz wafer is then placed in a commercial chrome etchant such as type TFD at about 25° C. for about 2 minutes followed by a deionized water rinse for at least 30 seconds.

Referring to FIGS. 6 and 8, the next process step 206 provides for the etching of the quartz wafer 102. The quartz wafer 102 is placed into a supersaturated solution of about 60 percent hydrofluoric acid and about 40 percent ammonium fluoride at about 80° C. for about 45 minutes, depending on the starting quartz wafer thickness 128. Other commercially available quartz etchants will work equally well. The quartz etchant will etch preferentially substantially along the atomic planes 122 of the quartz wafer 102. During etching, the atomic planes eventually define etched walls 124 of the channel 114. The confines of the narrow channel 114 cause a localized depletion of active quartz etchant in the channel 114. The depletion of the active quartz etchant causes the bottom of the narrow channel 116 to etch more slowly than a wider periphery 118 (as shown in FIG. 7) around the remainder of the quartz blank 100. After quartz etching is completed, the bottom of the channel 116 will have penetrated to about 25% percent of the quartz wafer thickness 128 while the periphery 118 (as shown in FIG. 7) around the quartz blank 100 shall have etched completely through the wafer 102.

In a preferred embodiment, the quartz wafer is originally provided with the Z-axis of the quartz aligned substantially perpendicular 136 to the channel 114. This particular alignment provides for non-intersecting etched walls 124 of the channels 114 due to the particular alignment of the atomic planes 122. More particularly, the non-intersecting, partially etched channels 114, provide at least a partial mechanical weakening of the quartz wafer 102 near the breakout edge 106 of the quartz blank 100 so that a clean singulation may be obtained when a bending force 134 is applied to the quartz blank 100.

The advantage of non-intersecting channels 114 is to allow deeper etching without mechanically weakening the quartz wafer 102 as much as co-linear etch channels 114 would mechanically weakening the wafer 102. Also, non-intersecting channels 114 require less etch rate discrimination between the narrow channel 114 and the wider periphery 118 (as shown in FIG. 7) defining the remainder of the quartz blank 100. This allows the use of a wider channel 114 geometry than might otherwise be needed. In addition, the deeper etching allows a substantially uniform bottom of the quartz channel 116 to be established for cleaner fracturing 132. However, it should be recognized that this invention can be used to etch intersecting, co-linear etch channels 114, but co-linear etch channels 114 may weaken the quartz wafer 102 before a substantially uniform channel bottom 116 is established.

Figure 9A:
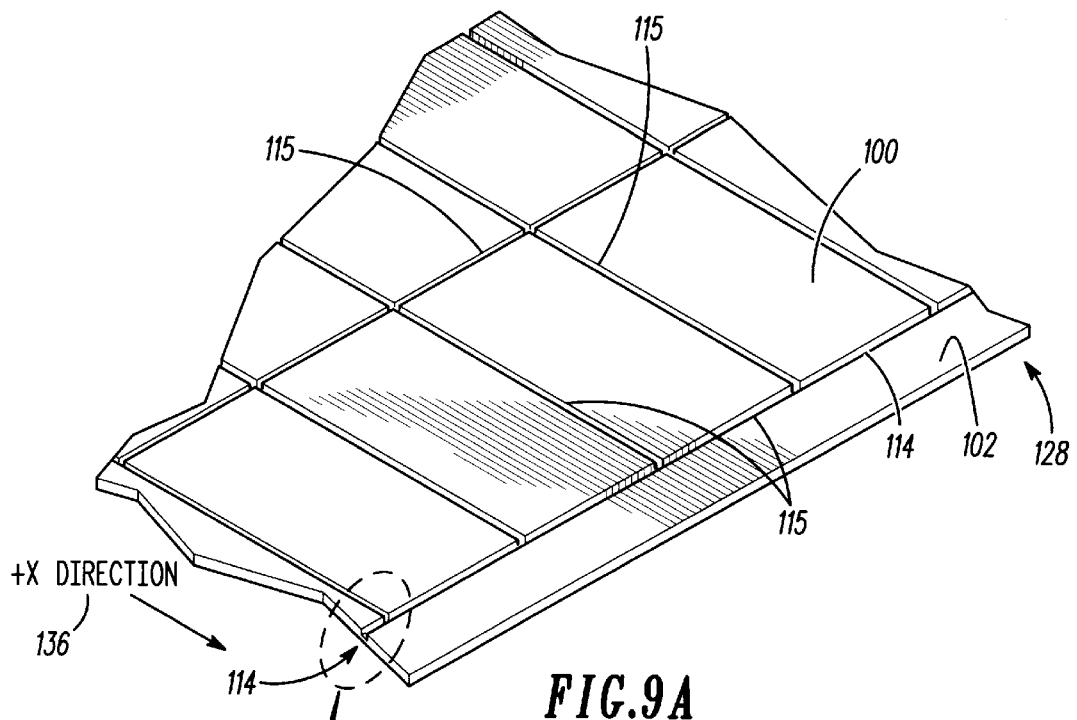
FIG. 9 shows a perspective view of an alternate preferred embodiment of a photolithographically produced quartz wafer before singulation, with an enlarged detailed view of the etched channels, in accordance with the present invention.
Figure 9B:
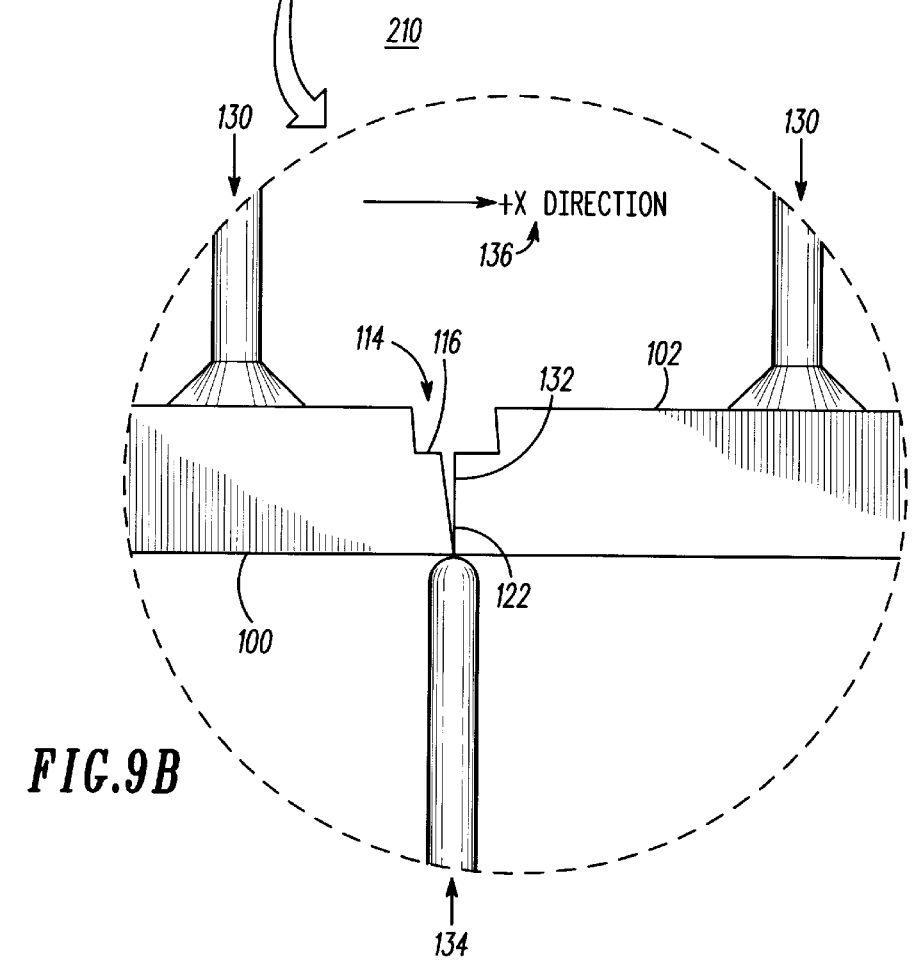

In an alternative preferred embodiment, as shown in FIG. 9, the channel 114 extends substantially around a perimeter 115 or outline defining the quartz blank 100. In this case, after quartz etching is completed, the bottom of the channel 116 will have penetrated down to about 25% percent of the quartz wafer thickness 128 and the quartz blank will remain connected to the quartz wafer 102 substantially around the entire perimeter 115 of the quartz blank 100.

In the alternate preferred embodiment, the quartz blanks 100 may be aligned to have their widths oriented in a crystallographic X-direction or Z-direction. In the present invention, where the quartz blanks 100 have their longer dimension or length referenced in the X-direction, the width of each quartz blank 100 is in the Z-direction. Similarly, where the quartz blanks 100 have their longer dimension or length referenced in the Z-direction, the width of each quartz blank 100 is in the X-direction. FIG. 9 shows quartz blanks having a Z-width and X-length crystallographic orientation. However, X-width, Z-length quartz blanks can be produced equally well. The angle of the etch channel shown, in the X-direction, is less pronounced than the angle as shown in FIG. 7. However, the same principles hold. The partially etched channels 114, provide a mechanical weakening of the quartz wafer 102 around the perimeter 115 of each quartz blank 100 so that a clean singulation may be obtained when a bending force 134 is applied to break the quartz blanks 100 from the quartz wafer 102 at the etch channel 114 along the perimeter 115.

The advantage of having the etch channel extend substantially around the perimeter of the quartz blank is that blank widths in both the X and Z-directions may be produced economically. Prior art methods of making quartz blanks required large spaces in the X-direction between the blanks because etching is slow in the X-direction and the preferred direction of etching is less perpendicular to the wafer surface than is the faster Z-direction etching. Because of this, very wide bevels form on the X-edges of a blank during etching which requires relatively large distances between blanks for complete etching to occur through the thickness of the quartz wafer. Spreading apart the location of the blanks on the wafer reduces the blank yield per wafer. The alternate preferred embodiment has the advantage that all of the blanks on the wafer abut one another with the narrow perimeter etch channel dividing them. In addition, the use of the etch channel does not require particular spacing between blanks since the blanks are mechanically separated from the wafer. Furthermore, blanks of X or Z-width can now be made equally well, without concern of etching rates or etching directions.

After quartz etching, the next process step provides for the stripping 208 of the photoresist layer 110 from the quartz wafer 102, as shown in block 208 in FIG. 8. In one embodiment, the photoresist may be stripped in a Shipley Microposit™ 142A Remover (available from Shipley of Newton, Mass.) at about 70° C. for about 15 minutes. However, acetone, alcohol or other suitable commercially available strippers may be used equally well.

Referring to FIGS. 7 and 8, the final major process step provides for the cleaving 210 of each quartz blank 100 from the quartz wafer 102 by clamping 130 the wafer 102 near the breakout edge 106 of each quartz blank 100 and applying a bending force 134 to the quartz blank 100. The bending force 134 causes a tensile stress concentration in the bottom of the channel 116. This stress propagates a fracture 132 substantially along one of the atomic planes 122 of the quartz wafer 102 thereby singulating the blank 100 from the wafer 102. The bending force.134 is applied in a manner so as to substantially prevent scratching of the surface of the blank 100. Preferably, the bending force 134 is applied at the free edge 104 of the quartz blank 100. However, in the alternate preferred embodiment the blanks may be singulated from the wafers using bending and breaking techniques commonly used in the semiconductor industry.

The advantage provided by the fracturing 132 the bottom of the channel 116 along atomic planes 122, is to minimize fragmentation of the quartz wafer 102, which minimizes particulate contamination on the surface of the quartz blank 100. Also, this fracturing 132 provides a cleaner and more efficiently and effectively singulated quartz blank 100 than is available by etching through the wafer. Also, the quartz blank presents a smooth breakout edge 106 which can be mounted equally as well as a freely etched edge 104 of the blank 100. Less inspection and quality control processing are required, and the clean singulation of the quartz blank 100 contributes to increasing yields and can subsequently lower costs since fewer quartz blanks 100 are broken during the singulation process. Also, the uniform dimension of the breakout edge 106 of the quartz blank 100 readily allows the use of automation without placement problems due to blank 100 irregularities.

Example

It is important to maintain repeatable dimensions of each quartz blank within a wafer, and from wafer-to-wafer, so as to ensure repeatable device performance in the field. The present invention provides more repeatable blank dimensioning than is available in the prior art. In this example, the edge width dimension of several blanks made using conventional etch-through techniques were measured and compared to the edge widths of blanks made using the present invention. Conventionally manufactured blanks showed an statistical distribution of blank edge width dimension of ±0.46 mils (±11.5 μm) to 3-sigma. The present invention, due to its inherent nature, provided repeatable edge locations that fell with the 0.5 mil (12.7 μm) etch channel width, or ±0.25 mils (±6.5 μm) to 3-sigma. Therefore, the present invention provides blanks with much better dimensional repeatability than conventional etch-through techniques.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A method of etching photolithographically produced quartz crystal blanks for singulation, comprising:
    providing a quartz wafer coated with at least one metal layer and a photoresist layer, respectively;
    removing a plurality of patterns from the photoresist and the metal layer to expose a plurality of quartz channels each having a bottom, each quartz channel extending substantially around a perimeter defining a plurality of quartz blanks;
    etching the bottom of the channels along substantially parallel quartz atomic planes, whereby the bottom of the channel does not etch through the quartz wafer;
    stripping the remaining photoresist layer from the metal layer; and
    cleaving substantially along the bottom of each channel and along substantially aligned quartz crystal atomic plane, to singulate each quartz blank from the quartz wafer and from other quartz blanks.

2. The method of claim 1, wherein the etching step includes exposing the bottom of the channel to etchant for a sufficiently long time to at least partially mechanically weaken the quartz wafer in proximity to the channel.

3. The method of claim 1, wherein the cleaving step includes singulating the quartz blank from the quartz wafer and other quartz blanks by applying a tensile force to an interior portion of the channel, whereby fragmentation of the quartz is minimized.

4. The method of claim 1, wherein the removing step includes a pattern chosen to define a channel of sufficiently narrow width such that the active etchant become depleted so as to retard an etching rate.

5. The method of claim 4, wherein the etching step provides a width of the channel of about 0.5 mils (12.7 μm).

6. The method of claim 1, wherein the etching step includes the bottom of the channel having a channel depth of about 10 to about 40 percent of the quartz wafer thickness.

7. The method of claim 6, wherein the etching step includes the bottom of the channel having a channel depth of about 25 percent of the quartz wafer thickness.

8. A method of etching photolithographically produced quartz crystal blanks for singulation, comprising:

providing a quartz wafer coated with a metal layer and a photoresist layer, respectively, on both sides of the wafer;

removing a plurality of patterns from the photoresist and the metal layer on one side of the wafer to expose a plurality of quartz channels each having a bottom, each quartz channel extending substantially around a perimeter defining a plurality of quartz blanks etching the perimeter defining the quartz blanks and the bottom of the channels along substantially parallel quartz atomic planes, whereby etched walls of the channel are formed and defined by the substantially parallel atomic planes and the bottoms of the channel has a depth of about 10 to about 40 percent of the quartz wafer thickness;

stripping the photoresist from the metal layers; and cleaving substantially along the bottom of each channel and along substantially aligning quartz crystal atomic plane to singulate each quartz blank from the quartz wafer and other quartz blanks, whereby fragmentation of the quartz is minimized.

9. The method of claim 8, wherein the etching step provides a width of the channel of about 0.5 mils (12.7 $\mu$m) so as to deplete the active etchant to retard an etching rate.

10. The method of claim 8, wherein the etching step includes the bottom of the channel having a channel depth of about 25 percent of the quartz wafer thickness.

* * * * *